(12) United States Patent
Xu et al.

(10) Patent No.: US 8,889,332 B2
(45) Date of Patent: Nov. 18, 2014

(54) LOW-K DIELECTRIC FUNCTIONAL IMPRINTING MATERIALS

(75) Inventors: Frank Y. Xu, Round Rock, TX (US); Jun Sung Chun, Austin, TX (US); Michael P. C. Watts, Austin, TX (US)

(73) Assignees: Canon Nanotechnologies, Inc., Austin, TX (US); Molecular Imprints, Inc., Austin, TX (US)

(*) Notice: Subject to any disclaimer, the term of this patent is extended or adjusted under 35 U.S.C. 154(b) by 461 days.

(21) Appl. No.: 13/172,350

(22) Filed: Jun. 29, 2011

(65) Prior Publication Data

US 2011/0256355 A1    Oct. 20, 2011

Related U.S. Application Data

(63) Continuation of application No. 10/967,740, filed on Oct. 18, 2004, now abandoned.

(51) Int. Cl.
    G03F 7/028    (2006.01)
    G03F 7/038    (2006.01)
    G03F 7/075    (2006.01)

(52) U.S. Cl.
    USPC .................. 430/270.1; 430/280.1; 430/285.1; 430/287.1

(58) Field of Classification Search
    USPC ....................................... 430/270.1; 423/335
    See application file for complete search history.

(56) References Cited

U.S. PATENT DOCUMENTS

| | | | |
|---|---|---|---|
| 5,028,511 A | 7/1991 | Choi | |
| 5,102,977 A | 4/1992 | McLafferty et al. | |
| 5,182,174 A | 1/1993 | Stephenson | |
| 5,366,768 A | 11/1994 | Kasari et al. | |
| 5,395,954 A | 3/1995 | Soria et al. | |
| 5,620,777 A | 4/1997 | Goto et al. | |
| 5,753,781 A * | 5/1998 | Oxman et al. ................. | 525/415 |

(Continued)

FOREIGN PATENT DOCUMENTS

| | | |
|---|---|---|
| EP | 2221664 | 8/2010 |
| JP | 4-366958 | 12/1992 |

(Continued)

OTHER PUBLICATIONS

Zhang et al. Hydrosilyation of Allyl Slchohol with [HsiMeOsiO]: Octa(3-hydroxypropyldimethylsiloxy) octasilsesquioxane and its Octamethacrylate Derivitive as Potential Precusrors to Hybrid Nanocomposites; JACS, 200, 122(29) pp. 6979-6988; Jan. 1, 2000.

(Continued)

Primary Examiner — Sin J. Lee
(74) Attorney, Agent, or Firm — Heather L. Flanagan; Fish & Richardson P.C.; Cameron A. King

(57) ABSTRACT

A polymerizable composition includes an organic modified silicate selected from the group consisting of silsesquioxanes having the composition $RSiO_{1.5}$, partially condensed alkoxysilanes, organically modified silicates having the composition $RSiO_3$ and $R_2SiO_2$, and partially condensed orthosilicates having the composition $SiOR_4$, where R is an organic substituent; a decomposable organic compound; a photoinitiator; and a release agent. The composition polymerizes upon exposure to UV radiation to form an inorganic silica network, and the decomposable organic compound decomposes upon exposure to heat to form pores in the inorganic silica network. The composition may be used to form a patterned dielectric layer in an integrated circuit device. A metallic film may be disposed on the patterned dielectric layer and then planarized.

13 Claims, 3 Drawing Sheets

(56) References Cited

U.S. PATENT DOCUMENTS

| | | | |
|---|---|---|---|
| 5,792,550 A | 8/1998 | Phillips et al. | |
| 5,895,263 A | 4/1999 | Carter et al. | |
| 5,928,767 A | 7/1999 | Gebhardt et al. | |
| 6,200,736 B1 | 3/2001 | Tan | |
| 6,271,273 B1* | 8/2001 | You et al. | 521/61 |
| 6,329,017 B1 | 12/2001 | Liu et al. | |
| 6,334,960 B1 | 1/2002 | Willson et al. | |
| 6,355,751 B1* | 3/2002 | Hale et al. | 526/279 |
| 6,410,209 B1 | 6/2002 | Adams et al. | |
| 6,435,948 B1 | 8/2002 | Molnar | |
| 6,465,365 B1 | 10/2002 | Annapragada | |
| 6,483,174 B1 | 11/2002 | Crafts et al. | |
| 6,497,961 B2 | 12/2002 | Kang et al. | |
| 6,573,131 B2 | 6/2003 | Yan et al. | |
| 6,592,764 B1 | 7/2003 | Stucky et al. | |
| 6,660,245 B1 | 12/2003 | Gaynor et al. | |
| 6,731,857 B2 | 5/2004 | Shelnut et al. | |
| 6,790,790 B1 | 9/2004 | Lyons et al. | |
| 6,873,087 B1 | 3/2005 | Choi et al. | |
| 6,897,259 B1 | 5/2005 | Cramer et al. | |
| 6,932,934 B2 | 8/2005 | Choi et al. | |
| 6,936,194 B2 | 8/2005 | Watts | |
| 6,957,608 B1 | 10/2005 | Hubert | |
| 6,960,327 B2 | 11/2005 | Navrotsky et al. | |
| 7,077,992 B2 | 7/2006 | Sreenivasan et al. | |
| 7,090,716 B2 | 8/2006 | McMackin et al. | |
| 7,122,079 B2 | 10/2006 | Xu et al. | |
| 7,138,362 B2 | 11/2006 | Abe et al. | |
| 7,141,188 B2 | 11/2006 | Li et al. | |
| 7,157,036 B2 | 1/2007 | Choi et al. | |
| 7,160,949 B2 | 1/2007 | Ota et al. | |
| 7,179,396 B2 | 2/2007 | Sreenivasan | |
| 7,253,130 B2 | 8/2007 | Chiang et al. | |
| 7,303,989 B2 | 12/2007 | Boyanov et al. | |
| 7,307,118 B2 | 12/2007 | Xu et al. | |
| 7,314,792 B2 | 1/2008 | Kim et al. | |
| 7,365,375 B2 | 4/2008 | Goodner et al. | |
| 7,384,622 B2 | 6/2008 | Hata et al. | |
| 7,396,475 B2 | 7/2008 | Sreenivasan | |
| 7,405,459 B2 | 7/2008 | Ogihara et al. | |
| 7,422,774 B2 | 9/2008 | Zheng et al. | |
| 7,422,776 B2 | 9/2008 | Yim et al. | |
| 7,629,272 B2 | 12/2009 | Waldfried et al. | |
| 7,662,527 B2 | 2/2010 | Wu et al. | |
| 7,750,059 B2* | 7/2010 | Jung et al. | 522/6 |
| 7,819,652 B2 | 10/2010 | Lee et al. | |
| 7,906,180 B2 | 3/2011 | Xu et al. | |
| 2002/0137857 A1* | 9/2002 | Lange et al. | 526/64 |
| 2003/0054115 A1 | 3/2003 | Albano et al. | |
| 2003/0127002 A1 | 7/2003 | Hougham et al. | |
| 2003/0151032 A1* | 8/2003 | Ito et al. | 252/570 |
| 2004/0065252 A1 | 4/2004 | Sreenivasan et al. | |
| 2004/0065976 A1 | 4/2004 | Sreenivasan | |
| 2004/0102032 A1* | 5/2004 | Kloster et al. | 438/623 |
| 2004/0124566 A1 | 7/2004 | Sreenivasan et al. | |
| 2004/0137734 A1* | 7/2004 | Chou et al. | 438/689 |
| 2004/0188381 A1 | 9/2004 | Sreenivasan | |
| 2004/0202872 A1 | 10/2004 | Fang et al. | |
| 2004/0211754 A1 | 10/2004 | Sreenivasan | |
| 2004/0229158 A1 | 11/2004 | Meador et al. | |
| 2005/0100830 A1 | 5/2005 | Xu et al. | |
| 2005/0187339 A1 | 8/2005 | Xu et al. | |
| 2005/0238967 A1 | 10/2005 | Rogers et al. | |
| 2006/0024976 A1 | 2/2006 | Waldfried et al. | |
| 2006/0081557 A1 | 4/2006 | Xu et al. | |
| 2006/0177535 A1 | 8/2006 | McMackin et al. | |
| 2006/0214330 A1 | 9/2006 | Dumond et al. | |
| 2006/0224009 A1 | 10/2006 | Hamada et al. | |
| 2007/0117408 A1 | 5/2007 | Nguyen et al. | |
| 2007/0123059 A1 | 5/2007 | Haverty et al. | |
| 2007/0160639 A1 | 7/2007 | Pantelidis et al. | |
| 2007/0190777 A1 | 8/2007 | Jiang et al. | |
| 2008/0000373 A1 | 1/2008 | Petrucci-Samija et al. | |
| 2008/0055581 A1 | 3/2008 | Rogers et al. | |
| 2008/0143015 A1 | 6/2008 | Lee et al. | |
| 2008/0160129 A1 | 7/2008 | Resnick et al. | |
| 2008/0197503 A1 | 8/2008 | Hsu et al. | |
| 2008/0199632 A1 | 8/2008 | Wolden et al. | |
| 2009/0140458 A1 | 6/2009 | Xu et al. | |
| 2009/0266418 A1 | 10/2009 | Hu et al. | |
| 2010/0072671 A1 | 3/2010 | Schmid et al. | |
| 2010/0084376 A1 | 4/2010 | Khusnatdinov et al. | |
| 2010/0104852 A1 | 4/2010 | Fletcher et al. | |
| 2010/0108639 A1 | 5/2010 | Kasono | |
| 2010/0109201 A1 | 5/2010 | Fletcher et al. | |
| 2010/0109203 A1 | 5/2010 | Chen et al. | |
| 2011/0140306 A1 | 6/2011 | Xu et al. | |
| 2011/0183027 A1 | 7/2011 | Miller et al. | |
| 2011/0189329 A1 | 8/2011 | Miller et al. | |

FOREIGN PATENT DOCUMENTS

| | | |
|---|---|---|
| KR | 20070031858 | 8/2010 |
| WO | WO/97/06012 | 2/1997 |
| WO | WO/00/20290 | 4/2000 |
| WO | WO/2005/007764 | 1/2005 |
| WO | WO/2005/036681 | 4/2005 |
| WO | WO/2006/044690 A2 | 4/2006 |
| WO | WO/2008/126313 | 10/2008 |
| WO | WO/2009/067241 A1 | 5/2009 |
| WO | WO/2010/047821 | 4/2010 |
| WO | WO/2011/004991 | 1/2011 |

OTHER PUBLICATIONS

DuPont Zonyl Fluorochemical Intermediates; www.dupont.com/zonyl/pdf/intermediates.pdf; pp. 1-16; Jun. 21, 2003.

3M Novec Fluorosurfactant FC-4432; http://multimedia.mmm.com/mws/mediawebserver.dyn?333333SQa783cMj3wMj333wyXuFiiiiH-; Aug. 4, 2005.

Padovani et al. Chemically Bonded Porogens in Methylsilsesquioxane: I. Structure and Bonding; Journal of the Electrochemical Society, 149 (12) F161-F170; Oct. 16, 2002.

Wolf et al. Silicon Processing for the VLSI Era; vol. 1—Process Technology, pp. 407-413; Jan. 1, 1986.

Golden et al. Designing Porous Low-k Dielectrics; www.reed-electronics.com/semiconductor/index.asp?layout=articlePrint&articleID=CA82824; Apr. 6, 2005.

Xia et al. Soft Lithography; Angew. Chem. Int. Ed., Jan. 1, 1998; pp. 550-575.

Golden et al. Designing Porous Low-k Dielectrics; retrieved online Apr. 6, 2005 from www.reed-electronics.com/semiconductor/index.asp?layout=articlePrint&articleID=CA82824.

Padovani et al. Chemically Bonded Porogens in Methylsilsesquioxane: I. Structure and Bonding; Journal of the Electrochemical Society, 149 (12) Oct. 16, 2002 F161-F170.

Wolf et al. Silicon Processing for the VLSI Era; vol. 1—Process Technology, Jan. 1, 1986; pp. 407-413.

DuPont Zonyl UR; www.dupont.com/zonyl/pdf/UR.pdf; Jun. 21, 2003; pp. 1-2.

Pham et al. Direct Spray Coating of Photoresist—A New Method for Patterning 3-D Structures; 16th Annual European Conference on Solid-State Tranducers, Sep. 16-18, 2002, Czech Republic pp. 182-185.

Song; Study of demolding process in thermal imprint lithography via numerical simulation and experimental approaches; Dec. 1, 2007; Thesis Submitted to Graduate Faculty of the Louisiana State University Agricultural and Mechanical College.

McLeary et al. Zeolite-based films, membranes, and membrane reactors: progress and prospects; Microporous and Mesoporous Materials 90 (2006) 198-200.

Devine on the structure of low-temperature PECVD silicon dioxide films; J. Electron. Mater. 19 (1990) 1299-1301.

Cao et al. Density change and viscous flow during structural relaxation of plasma-enhanced chemical-vapor-deposited silicon oxide films; J. Appl. Phys. 96 (2004) 4273-4280.

Johnson et al. Effect of calcination and polycrystallization on mechanical properties of nanoporous MFI zeolites; Materials Science and Engineering A 456 (2007) 58-63.

(56) References Cited

OTHER PUBLICATIONS

Dong et al. Template-removal-associated microstructural development of porous-ceramic-supported MFI zeolite membranes; Microporous and Mesoporous Materials 34 (2000) 241-253.

Tang et al. Microwave synthesis of MFI-type zeolite membranes by seeded secondary growth without the use of organic structure directing agents; Jan. 1, 2008; Microporous and Mesoporous Materials 118:1-3 (2009) 224-231.

Kim et al. Fabrication of three-dimensional microstructures by soft molding; Applied Physics Letters, American Institute of Physics, Melville, NY. vol. 79, No. 14, pp. 2285-2287 Oct. 1, 2001.

Thoma et al. Vapor phase transport synthesis of zeolites from sol-gel precursors; Sep. 21, 2000; Microporous and Mesoporous Materials 41, pp. 295-305.

Motuzas et al. Ultra-rapid production of MFI membranes by coupling microwave-assisted synthesis with either ozone or calcination treatment; Nov. 7, 2006; Microporous and Mesoporous Materials, 99: 1-2 pp. 197-205.

Kanezashi et al. Template-free synthesis of MFI-type zeolite membranes: Permeation characteristics and thermal stability imprivements of membrane structure; Sep. 30, 2006; Journal of Membrane Science, 286: 1-2, 213-222.

Li et al. Microwave synthesis of zeolite membranes: a review; Sep. 17, 2007; Journal of Membrane Science, 316:1-2, 3-17.

Gualtieri et al. The influence of heating rate on template removal in silicalite-1: an in situ HT-XRPD study; Nov. 16, 2005; Microporous and Mesoporous Materials 89: 1-3 pp. 1-8.

Li etal. Effects of crysallinity in spin-on pure-silica-zeolite MFI low-dielectric-constant films; Advanced Functional Materials 14:10, 1019-1024; Oct. 1, 2004.

Levy et al. A comparitive study of plasma enhanced chemically vapor deposited Si—O—H and Si—N—C—H films using the environmentally benign precursos diethylsilane; Materials Letters 54, May 1, 2002; pp. 102-107.

Stoney The tension of metallic films deposited by electroysis; Proc. R. Soc. London UK, Ser. A 82, 172; Sep. 1, 1909.

Chen et al. Effect of Trimethylsilylation on the Film Stress of Mesoporous Silica Ultralow-k Film Stacks; Electrochem. Solid-State Letters, 9 (6) G215-G218; Apr. 7, 2006.

Breck et al. Zeolite molecular sieves: structure, chemistry, and use; John Wiley and Sonds, NY USA, p. 637, Jan. 1, 1974.

Shackelford Gas solubility in glasses—principles and structural implications, J. Non-Cryst. Solids 253 (1999), 231-241.

Xia et al. Sub-10 nm Self-Enclosed Self-Limited Nanofluidic Channel Arrays; Nano Letters 8:11 3830-3833; Oct. 2, 2008.

Peng et al. Analysis of the gas transport performance through PDMS/PS composite membranes using the resistances-in-series model; J. Membrane Sci 222, pp. 225-234; Jun. 23, 2003.

Mitra et al. Synthesis and evaluation of pure silica-zeolite BEA as low dielectric constant material for microprocessors; Ind. Eng. Chem. Res., 43:12, pp. 2946-2949; Jan. 1, 2004.

Zhang et al. Highly Porous Polyhedral Silsesquioxane Polymers. Systhesis and Characterization; J. Am. Chem. Soc. 120, Mar. 16, 1998; pp. 830-8391.

Prakash et al. Small volume PCR in PDMS biochips with integrated fluid control and vapour barrier; Sensors and Actuators B 113, 398-409; Apr. 28, 2005.

Yoda et al. Properties of high-performance porous SiOC Low-k film fabricated using electron-beam curing; Jpn. Journal Appl. Phys. 44, 3872-3878; Jun. 10, 2005.

Kulkarni et al. Electrical and structural characteristics of chromium thin films deposited on glass and alumina substrates; Thin Solid Films 301: 17-22; Nov. 15, 1996.

Bhushan et al. Friction and wear studies of silicon in sliding contact with thin-film magnetic rigid disks; J. Mater. Res. 9 pp. 1611-1628; Mar. 4, 1993.

Li et al. Mechanical characterization of micro/nanoscale structures for MEMS/NEMS applications using nanoindentation techniques; Ultramicroscopy 97 (2003) 481-494.

Boiko et al. Migration Paths of Helium in a-Quartz and Vitreous Silica from Molecular Dynamics Data; Glass Physics and Chemistry, vol. 29 No. 1, 2003, pp. 42-48.

Parsettensite Mineral Data; retrieved online Aug. 17, 2001 from www.webmineral.com/data/parsettensite.shtml; pp. 1-5.

Sohn et al. Nanoimprinting of thin polymer films using elementwise patterned stamp and subsequent application of pressurized air; Japanese Joournal of Applied Physics, Japan Society of Applied Physics, Tokyo, JP vol. 45, No. 7, pp. 5902-2905; Jul. 1, 2006.

International Search Report for application No. PCT/US08/12990; Feb. 25, 2009 7 pages. (WO2009/067241).

MELINEX 561 Datasheet; retrieved online Nov. 6, 2012 from http://www.dupontteijinfilms.com/FilmEnterprise/Datasheet.asp?ID=130&Version=US.

International Preliminary Report on Patentability for Application No. PCT/US05/37063 dated Jun. 14, 2006 (WO 2006/044690).

International Search Report and Written Opinion for Application No. PCT/US09/005775 dated Apr. 8, 2010, 12 pages (WO 2010/047821).

International Search Report and Written Opinion for Application No. PCT/US2011/023193 dated Aug. 19, 2011, 10 pages (WO 2011/094696 ).

International Search Report for Application No. PCT/US2011/022583, Aug. 10, 2011, 4 pages.

* cited by examiner

US 8,889,332 B2

LOW-K DIELECTRIC FUNCTIONAL IMPRINTING MATERIALS

CROSS-REFERENCE TO RELATED APPLICATION

This application is a continuation of U.S. application Ser. No. 10/967,740, filed Oct. 18, 2004.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND

The present invention relates to a method or material of fabricating integrated circuits, and in particular to a method of forming an integrated circuit on a substrate having a low dielectric constant, as well as a polymerizable composition for forming a patterned layer having low dielectric constant on a substrate.

There is a continuing desire in the microelectronics industry to increase the circuit density in multilevel integrated circuit devices, e.g., memory and logic chips, thereby increasing their performance and reducing their cost. In order to accomplish this goal, it is also desirable to reduce the minimum feature size on the chip, e.g., circuit line width, and also to decrease the dielectric constant of the interposed dielectric material to enable closer spacing of circuit lines without an increase in crosstalk and capacitive coupling. Further, there is a desire to reduce the dielectric constant of the dielectric materials such as utilized in the back end of the line (BEOL) portion of integrated circuit devices, which contain input/output circuitry, to reduce the requisite drive current and power consumption for the device.

The most commonly used dielectric material in integrated circuits is silicon dioxide, which has a dielectric constant of about 4.0. Silicon dioxide is readily grown or formed on the surface of a planar silicon wafer that is used to form the majority of the current semiconductor devices. Silicon dioxide has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by current silicon dioxide. As inorganic materials have an inherent limitation to dielectric constants of lower than about three, several types of alternative materials have been developed to achieve lower dielectric constants. A number of these alternative materials are organic polymers, which, if at least partially fluorinated, can have a dielectric constant of less than about three. However, the development of appropriate organic polymers, as well as their depositions and patterning methods, poses significant challenges. The selection or choice of an organic material is frequently limited by the need for higher temperature steps in other aspects of the process, such as metallization or semiconductor fabrication. Another type of alternative material is an inorganic material with dispersed micro voids or pores to achieve a lower effective dielectric constant. Efforts to develop such materials are generally described in J. H. Golden, C. J. Hawker and P. S. Ho, "*Designing Porous low-K Dielectrics*," Semiconductor International, May 2001, which is incorporated herein by reference. Further, U.S. Pat. No. 5,895,263, to Carter, et al., which is incorporated herein by reference, teaches a process for forming an integrated circuit device comprising (i) a substrate; (ii) metallic circuit lines positioned on the substrate and (iii) a dielectric material positioned on the circuit lines. The dielectric material comprises porous organic modified polysilica.

Although porous inorganic materials can inherently withstand higher processing temperatures, like other dielectric materials, additional challenges arise due to the complexity of the patterning processes. Lithographic techniques are often employed in device micro fabrication. Traditionally, photolithography has been used to define or remove a portion of the dielectric material after it is deposited on the substrate. See S. Wolf et al., *Silicon Processing for the VLSI Era*, Volume 1—Process Technology, (1986), pp. 407-413, which is incorporated herein by reference. Using microcircuit fabrication as an example, photo resist materials are applied to a dielectric material after deposition on a planar substrate. Next, the resist layer is selectively exposed to a form of radiation. An exposure tool and mask are often used to affect the desired selective exposure. Patterns in the resist are formed when the dielectric layer undergoes a subsequent "developing" step. The areas of resist remaining after development protect the dielectric and substrate regions that they cover. Locations from which resist has been removed can be subjected to a variety of additive (e.g., lift-off) or subtractive (e.g., etching) processes that transfer the pattern onto the substrate surface. However, photolithography has inherent size limitations that demand the use of shorter wavelength sources and more sophisticated optics to reduce the line width and feature sizes in the micro circuitry.

Thus in the process of U.S. Pat. No. 5,895,263 the low-K dielectric layer must be first formed, and then patterned prior to deposition of the conductor material. The plurality of required processing steps inherently increases the processing time, resulting in higher costs as well as generally reduced product yield.

Further, as it is desirable to decrease the size of circuit features, that is line width and spacing between conductors, the alternative inorganic materials must be capable of deposition with pore sizes that are a fraction of the size of these features.

It is therefore a first object of the present invention to provide an improved method of fabricating an integrated circuit device comprising a low dielectric constant material between conductive lines and/or vias.

It is another object of the present invention to provide a process to deposit a patterned low dielectric constant inorganic material on a planar substrate in a minimum number of process steps.

It is a further object of the invention to provide a robust, repeatable process for depositing a patterned low dielectric constant inorganic material.

Other objects and advantages will be apparent from the following disclosure.

SUMMARY

In the present invention, the aforementioned objects are achieved by deploying imprint lithography to mold a relief image corresponding to microcircuit features on a substantially planar substrate. The imprint molding process deploys a polymerizable resin composition that is subsequently converted to a porous low dielectric constant inorganic material.

The method of forming a relief image involves at least the steps of covering a substantially planar substrate with a polymerizable fluid composition; then contacting the polymerizable fluid composition with a mold having a relief structure formed therein such that the polymerizable fluid composition substantially fills the relief structure in the mold; subjecting the polymerizable fluid composition to conditions to polymerize the fluid composition and form a solidified polymeric material there rom on the substrate; separating the mold from the solid polymeric material such that a replica of the relief structure in the mold is formed in the solidified polymeric material. The polymerizable composition is preferably a UV curable organic modified silicate that comprises a decomposable organic component known as a porogen. Pores remain as the organic porogen decomposes during the subsequent processing that converts the polymerized organic modified silicate to an inorganic material.

As the UV curing is preferably conducted through a mold that is UV transparent, another object of achieving a robust process for imprinting includes using a UV curable polymerizable fluid that includes an organic modified silicate, a decomposable organic compound, and a fluorosurfactant to improve the release of the cured composition from the imprint-molding tool.

Other objects of the invention are achieved by using a process that includes the steps of providing a composition that includes a UV curable organic modified silicate, a decomposable organic compound and a solvent; then spin coating the composition on a substrate, removing the solvent, imprinting a circuit pattern in the remaining composition, UV curing the remaining composition, heating the composition to condense the organic modified silicate and decompose the decomposable polymer to form a porous patterned dielectric layer, and depositing metal conductors within the patterns formed in the porous dielectric material.

The above and other objects, effects, features, and advantages of the present invention will become more apparent from the following description of the embodiments thereof taken in conjunction with the accompanying drawings.

DETAILED DESCRIPTION

Figure 1:
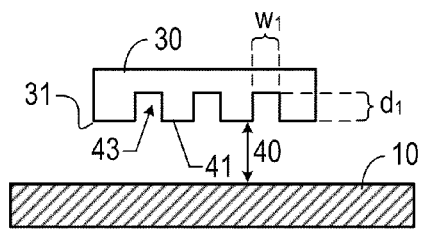
FIG. 1 is schematic sectional elevation showing the mold with respect to the substrate, as the first step in the process of imprinting a low dielectric constant material.

Referring to FIGS. 1 through 8, wherein like reference numerals refer to like components in the various views, there is illustrated therein a new and improved circuit having a low dielectric constant, generally denominated 100 herein.

Methods of imprinting to form a relief pattern are taught in U.S. Pat. No. 6,334,960, to Wilson, et al., the disclosure of which is incorporated herein by reference.

In the instant invention, the polymerizable material is a modified silicate having organic functional groups that upon exposure to actinic radiation cross-link or react to form a non-fluid material replicating the shape of the mold. The cured or polymerized organic modified silicate is subsequently, after removal of the mold, converted to an inorganic silicate upon thermal decomposition of the organic functional groups therein. The polymerizable material also contains one or more components, which upon decomposition form pores or voids in the inorganic silicate. As shown in further detail in FIGS. 7 and 8, the pore forming material may be a separate component mixed, dissolved or dispersed on the polymerizable materials, or can also be chemically bonding to the organic modified silicate. After conversion of the polymerizable fluid to a solid that replicates the mold, one or more steps are used to decompose the organic groups bound to the silicate and the pore forming material, as well as to substantially complete the conversion to an inorganic silicate wherein water is condensed from the remaining hydroxyl group bound to silicon forming Si—O—Si linkages. The process is carried out in a manner such that the silicate network forms around the decomposing pore forming material, leaving nanometer scale voids or pores behind. The polymerizable fluid composition may also comprise a diluent, and other materials employed in polymerizable fluids such as, but not limited to, catalysts and photo initiators, as will be further described below with respect to preferred embodiments.

The mold used in the methods of the invention may be formed from various conventional materials, such as, but not limited to, quartz, silicon, organic polymers, siloxane polymers, borosilicate glass, fluorocarbon polymers, metal, and combinations of the above. Preferably, the material is selected such that the mold is UV transparent, which allows the polymerizable fluid composition covered by the mold to be exposed to an external radiation source. Thus, quartz molds are most preferred. To facilitate release of the mold from the solid polymeric material, the mold may be treated with a surface modifying agent. Surface modifying agents that may be employed include those that are known in the art. An example of a surface modifying agent is a fluorocarbon silylating agent. These surface modifying agents or release materials may be applied, for example, from plasma sources, a Chemical Vapor Deposition method (CVD) such as analogs of the Parylene deposition process, or a treatment involving deposition from a solution.

The methods of the invention will now be described in detail to the accompanying drawing in which a preferred embodiment of the invention is shown. FIG. 1 illustrates the first step in the step-by-step sequence for carrying out the method of the invention, which is depositing a low-k dielectric material and circuit pattern on a substrate 10. As shown in FIG. 1, a UV transparent mold 30 is brought into proximity with substrate 10 such that gap 40 is formed between the bottom surface 31 of mold 30 and substrate 10. Mold 30 has a nanoscale relief structure formed therein having an aspect ratio preferably ranging from about 0.1 to about 10, and more preferably from about 0.5 to about 2. Specifically, the relief structures in the mold typically consist of a plurality of protrusions 41, each pair of which defines a recession 43 therebetween. An exemplary width $W_1$ and depth $d_1$ of protrusions 41 and recessions 43 may be from about 10 nm to about 5,000 microns. However, it should be understood that protrusions 41 and recessions 43 may correspond to virtually any feature.

Figure 2:
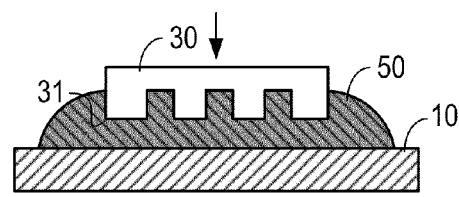
FIG. 2 is schematic sectional elevation showing the disposition of the polymerizable fluid between the mold and the substrate, as the next step in the process of imprinting a low dielectric constant material.

Referring to FIG. 2, the polymerizable fluid composition preferably has a low viscosity such that it may fill recessions 43 in an efficient manner to form a contiguous layer of composition 50 over substrate 10. For example, the viscosity of composition 50 may range from about 0.01 centipoises (cps) to about 100 cps measured at 25° C. and more preferably from about 0.01 cps to about 5 cps measured at this temperature. An exemplary technique for depositing composition 50 employs depositing one or more spaced-apart discrete droplets (not shown) of composition 50 on substrate 10. Typically the droplets (not shown) are arranged in a pattern that minimizes trapping of gases when the droplets (not shown) of composition 50 merge to form a contiguous layer over substrate 10 by interaction with mold 30, e.g., mechanical contact, electrical contact and the like. In an exemplary embodiment, droplets (not shown) of composition 50 are disposed on substrate 10. Contact between mold 30 and the droplets (not shown) is effectuated. In response, composition 50 forms a contiguous layer over substrate 10. It may be desired to purge the region of substrate 10, for example, with helium gas flowed at 5 pounds per square inch (psi), defined between mold 30 and both substrate 10 and droplets (not shown) before contact between mold 30 and composition 50 occurs. An exemplary purging technique is disclosed in U.S. Pat. No. 7,090,716 to McMackin et al., entitled SINGLE PHASE FLUID IMPRINT LITHOGRAPHY METHOD, which is incorporated by reference herein.

Alternatively, the polymerizable fluid can be first deposited as a substantially uniform fluid layer on substrate 10 employing, for example, spin-coating techniques. Thereafter mold 30 is brought to the same proximity as shown in FIG. 2. In such cases, the fluid need not have such a low viscosity, but the viscosity of the fluid should be less than about 200,000 cPs.

Further, to the extent that it is otherwise preferable to use different cross-linkable organic polysilicates having higher molecular weight than the preferred oligomers, as described below, the mixture may contain a solvent as an inert diluent. The solvent may be selected to dissolve a particular pore forming material as well as a fluorosurfactant (described in the more preferred embodiments below) or simply to lower the viscosity to a level low enough for spin coating on a planar substrate. After spin coating, the solvent is removed by vacuum or thermal evaporation, for example at about 100° C. for about 1 min. The then solvent free, planarized fluid can be directly imprinted by contacting the mold thereto.

Suitable substrates for the device of the present invention comprise silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Referring now to FIG. 2, the polymerizable fluid composition 50 is then exposed to conditions sufficient to polymerize the fluid. Preferably, the polymerizable fluid composition 50 is exposed to radiation sufficient to polymerize the fluid composition and form a solidified polymeric material represented by 60 in FIG. 3. More specifically, the polymerizable fluid composition is exposed to ultraviolet light, although other means for polymerizing the fluid may be employed such as, for example, heat or other forms of radiation. It should be understood that in some applications it might be desirable to use UV transparent substrates, in which case the exposure can be through the substrate, and in a further embodiment, the use of a mold that is opaque to UV light.

The selection of a method of initiating the polymerization of the fluid composition is known to one skilled in the art, and typically depends on the specific application that is desired. Generally speaking, organic modified polysilica is an oligomeric or polymeric compound comprising silicon, carbon, oxygen and hydrogen atoms. The polymerizable (or crosslinkable) materials that may be used in the methods of the invention may include various silicon-containing materials that are often present themselves in the form of polymers or oligomers. Suitable organic polysilica include (i) silsesquioxanes (ii) partially condensed alkoxysilanes (e.g., partially condensed by controlled hydrolysis tetraethoxysilane having a number average molecular weight of about 500 to 20,000); (iii) organically modified silicates having the composition $RSiO_2$ and $R_2SiO_2$ wherein R is an organic substituent and (iv) partially condensed orthosilicates having the composition $SiOR_4$. Silsesquioxanes are polymeric silicate materials of the type $RSiO_{1.5}$ where R is an organic constituent. The silicon-containing material preferably contains the element silicon in an amount greater than about 10 percent based on the weight of the polymerizable fluid composition, and more preferably, greater than about 20 weight percent.

The silicon-containing polymerizable material also includes one or more pendent functional groups from a variety that includes, as non-limiting examples, epoxy groups, ketone groups, acetyl groups, vinyl groups, acrylate groups, methacrylate groups, and combinations of the above. Although not wishing to be bound by any theory, it is believed that suitable polymerizable fluid compositions may react according to a variety of reaction mechanisms such as, but not limited to, acid catalysis, free radical polymerization, cationic polymerization, or 2+2 photocycloaddition, and the like.

Figure 7:
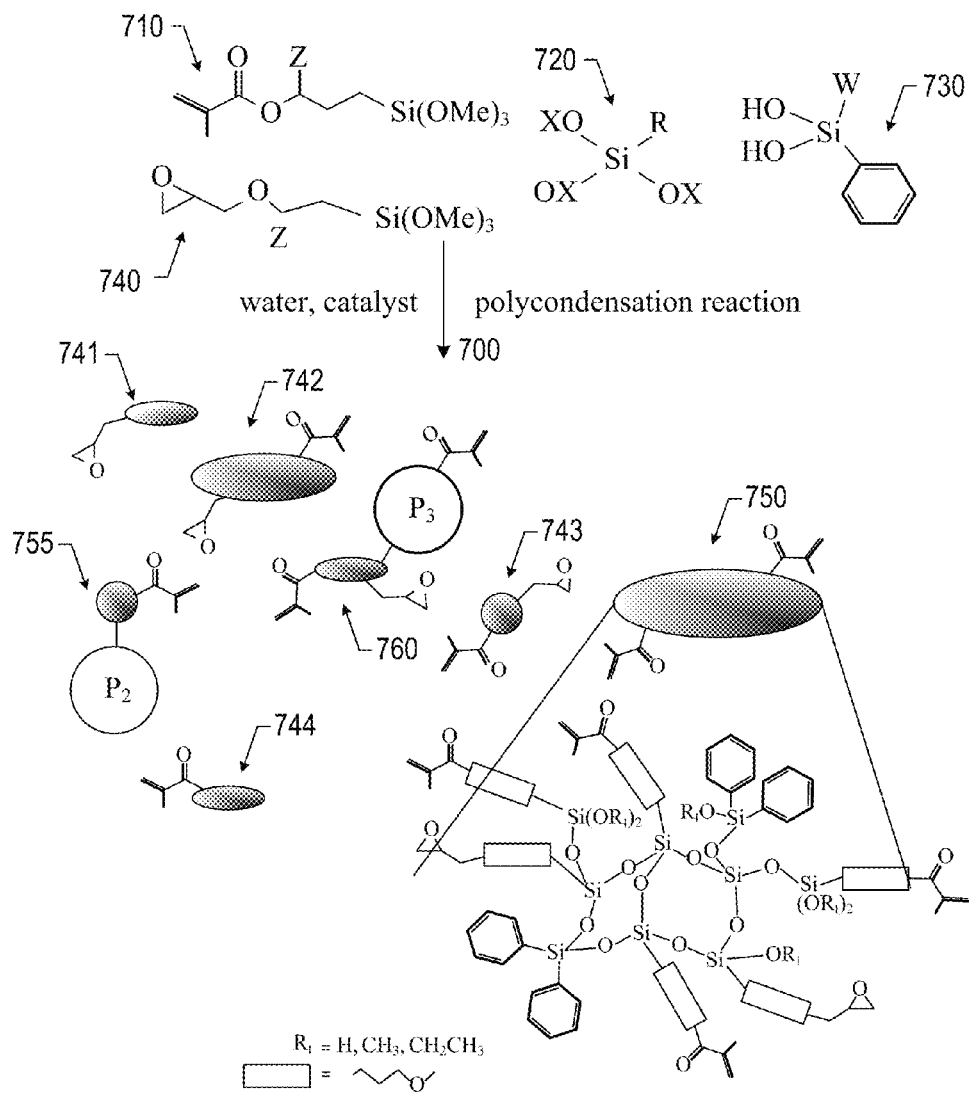
FIG. 7 is schematic illustration of alternative methods for creating a variety of organically modified silicates that are optionally used to form the polymerizable fluid.

The most preferable forms of organic polysilica are of relatively low molecular weight, but predominantly have two or more pendent and reactive functional groups per molecule. Such organically modified silicates are available under the trade name "ORMOCER" type resins and are available from Micro Resist Technology GmbH (Berlin, Germany). Typically, these materials are formed through the controlled hydrolysis and condensation of organically modified silanes, particularly alkyltrialkoxysilanes, such as the mixture of molecules 710, 720, 730 and 740 as illustrated in FIG. 7. As a non-limiting example for species 720 R—Si $(OX)_3$, a traditional alkoxide precursor, X may represent, for example, $CH_3$, $CH_2H_5$, $CH_3H_7$, and $CH_4H_9$. R may be any organic fragment such as methyl, ethyl, propyl, butyl, isopropyl, aryl, phenyl, as well as alkoxy (in which R is —(OX)). In molecule 730, W is preferably aryl or phenyl. The proportions of molecules of the type 710, 720, 730 and 740 may be modified to affect the molecular weight, extent of cross-linking and glass transition temperature of the potential resultant product species. A significant portion of the trialkoxysilane more preferably has a reactive functional group, as in species 710, where R now terminates in a methacrylate group. Alternatively, R can terminate in an epoxide group, as for example species 740. It should be appreciated that R can also terminate in methacrylate, acrylate, vinyl, epoxide, and the like to provide a cross-linkable functionally that is activated with UV light and the appropriate photo initiator and/or catalyst. For either of 710 and 740, Z is optionally H, $CH_3$, $CH_2H_5$, $CH_3H_7$, $C_4H_9$ or a pore forming material $P_2$ or $P_3$. As used herein, the term "ORMOCER" encompasses the foregoing materials as well as other organically modified ceramics, sometimes referred the trade names ORMACORE and ORMACLAD. It should be noted that for some portion of the composition, Si can alternatively be Ti, Zr, or Al to the extent it is desirable to produce a mixed metal oxide material to provide other properties than a lower dielectric constant.

Upon the condensation reaction 700, the aforementioned trialkoxysilane reactants form various types of cross-linked networks with one or more reactive functional groups. Thus, upon the initial condensation reaction —OX groups are eliminated such that a Si—O— bonded network is formed having the generic structure illustrated as 750. The silicate portion of the network 750 is illustrated schematically as an oval for the other species formed in condensation reaction 700. Depending on the exact composition and ratios of the initial reactants, polycondensation reaction 700 produces a variety of species having one of more methacrylate, acrylate, vinyl, epoxide, and the like pendent function groups capable of cross-linking with each other either thermally or on exposure to actinic radiation with a suitable photo initiator and/or catalyst. When R or Z is alternatively a porogen, designated P2 or P3 wherein the above condensation reaction bonds the porogen pendent groups to the Si—O— bonded network 750, as 755. P3 is intended to encompass structures and molecules having an additional pendent methacrylate, acrylate, vinyl, epoxide, and the like pendent function groups capable of cross-linking. P2 and P3 thus can be oligomeric or polymeric, to vary or optimize the pore size and distribution. For example, trimethoxysilyl norbornene (TMSNB) and triethoxysilyl norbornene (TESNB) polymers (Promerus, Brecksville, Ohio) have been used as such chemically bonded porogens as described by Padovani, et al in "Chemically Bonded Porogens in Methylsilsesquioxane, I. Structure and Bonding," Journal of the Electrochemical Society, 149 (12) F161-F170 (2002).), which is incorporated herein by reference. Alternatively, P1 or P2 can be poly (caprolactone) or other polyols of various molecular weights with polyhydroxyl terminated or branched hydroxyl terminated species preferred to minimize the viscosity of the polymerizable fluid.

Thus, reaction 700 results in, among others, species 741, which has a Si—O— bonded network 750 with an epoxide pendent group, whereas other products including species 744 which has a Si—O— bonded network 750 with a methacrylate pendent group. In contrast, as an alternative, species 742 has Si—O— bonded network 750 with both an epoxide and a methacrylate pendent group, while species 743 has a Si—O— bonded network 750 with two methacrylate pendent groups. Another product of reaction 700 is species 755 which has a Si—O— bonded network 750 with an epoxide, methacrylate and pore forming pendent group, P2. In species 760 the Si—O— bonded network 750 has both pendent epoxide and methacrylate groups as well as the pore forming pendent group, P3, with P3 having the third pendent reactive group, that is methacrylate, bonded or pendent from it.

Figure 8:
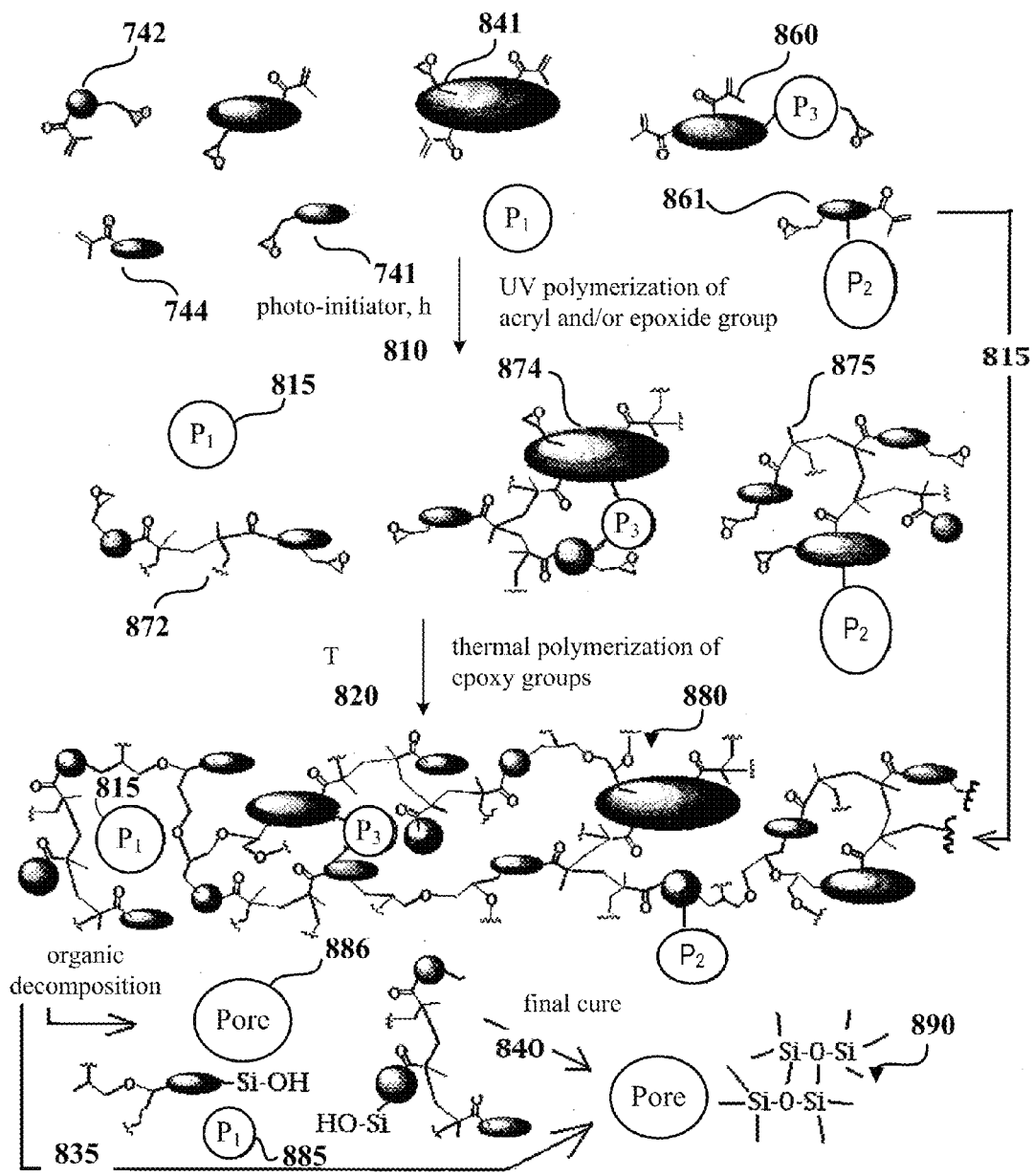
FIG. 8 is schematic illustration of the chemical reactions that occur during the polymerization of the fluid and the subsequent conversion to a porous dielectric material in FIGS. 2, 3 and 4.

FIG. 8 illustrates the chemical reactions that occur during the polymerization of the fluid 810 or 815 and the subsequent conversion to a porous dielectric material 835 or 840. Starting with the result of reaction 700 provides a substantial number of compounds comprising a Si—O— bonded network 750 with two or more pendent reactive groups suitable as the polymerizable fluid. It should be understood that the porogen, P1, could be present as a simple mixture that is either phase separated or dissolved in the polymerizable fluid. If the porogen is phase separated, it should be a stable emulsion with a particle size on the scale of 3 to 50 nm. The mixture can include other species, such as 841, a Si—O— bonded network 750 with an epoxide and two methacrylate pendent groups. In an alternative species 860, two methacrylate groups are pendent from the Si—O— bonded network 750, as well as a porogen group P3 having an epoxide group pendent from it. In species 861, an epoxide group, methacrylate groups and porogen are pendent from the Si—O— bonded network 750. Thus, the polymerizable fluid includes the Si—O— bonded network 750 with pendent reactive groups and a porogen material, bonded, dissolved or dispersed in the fluid.

Preferably, the subsequent polymerization step 815, wherein the fluid is exposed to actinic radiation with the mold in place, results in the solid cross-linked resin 880. Thus, if the mixture contains epoxide groups it is preferable to include a photo initiator that creates an acid such that the complete curing of a cross-linked network can be accomplished in a single step, such that the mold can be rapidly removed and used to imprint other devices or portions of a substrate.

Alternatively, depending on the photo initiator, the subsequent cross-linking reaction 810 may initially occur via the methacrylate groups. This may be preferable if one wishes to increase the viscosity or partially cross-link the organic silicate precursors before a final thermal cure process 820, which would cross-link any remaining epoxy groups, also forming a solid material having a three dimension cross-linked network 880. When epoxide groups are present after the initial exposure to actinic radiation, the curing can be accomplished in multiple steps, using what is termed a soft bake at between 80 to 120° C. for 5 min. or less, followed by a higher temperature cure at between about 120 to 240° C., for up to about 3 hrs.

Figure 4:
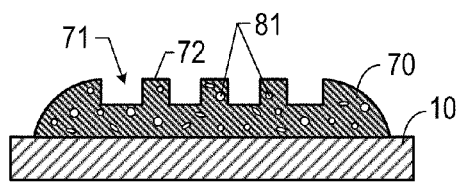
FIG. 4 is schematic sectional elevation showing the polymerized material disposed on the substrate after conversion to a porous dielectric material in a subsequent step in the process of imprinting a low dielectric constant material.

The final step to decompose the organic modified silicate, to form porous silicate 70 in FIG. 4, preferably occurs under conditions that heat the material to a temperature of about 425-450° C. for about 1 hour under nitrogen. However, the decomposition process conditions can also be carried out in stages, depending on the differential temperature dependence of the decomposition rates of the porogen as compared to the organic modified silicate. However, whether the organic decomposition and elimination of the porogen is a one-step process 835 leading to final porous dielectric material 890, or take place in two steps, fundamentally the same reaction chemistry occurs in step 830 as organic groups pendent on the silicon are decomposed. The organic modified silicate contains some hydroxyl groups as a result of the partial polycondensation reaction 700. The hydroxyl groups are represented in FIG. 8 by Si—OH. In the final step 840 at a higher temperature, water is condensed from adjacent Si—OH groups forming a substantially inorganic silica network. Simultaneously, the porogen P1, P2 or P3 materials that are phase segregated decompose, forming nanometer scale pores, preferably having a diameter of about 3 to 30 nm or about one tenth of the feature size $W_1$ and $d_1$.

Referring back to FIG. 3, upon completion of the curing or polymerization processes 815 or 810/820 described above, the mold 30 is removed to leave the solidified polymeric material 60 deposited on the substrate 10. The patterned organic silicate coating has grooves 61 surrounded by plateaus 62. As shown by FIG. 4 following either of reactions 835 or 840 the resultant patterned polymeric material 60 is converted to a substantially inorganic porous dielectric coating 70, that still includes groove 71 surrounded by plateaus 72, with a uniform dispersion of pores 81.

Another feature of the present invention is forming the dielectric material, which is positioned over the circuit lines and/or between the circuit lines and on the substrate. In multilevel integrated circuit devices, the dielectric material is often planarized to function as a substrate for lithographic formation of the next layer of circuit lines. The dielectric material comprises porous organic polysilicate.

Figure 5:
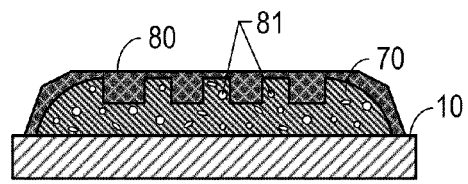
FIG. 5 is schematic sectional elevation showing the conductive material deposited over the porous dielectric material in a subsequent step in the process of forming a circuit.
Figure 3:
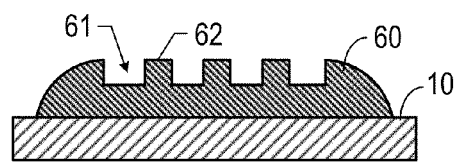
FIG. 3 is schematic sectional elevation showing the polymerized fluid disposed on the substrate after removal of the mold in a subsequent step in the process of imprinting a low dielectric constant material.

Referring to FIG. 5, in the next step of the process for forming the integrated circuit of the present invention, a metallic film 80 is deposited onto the patterned dielectric layer 70. Preferred metallic material is selected to provide suitable circuit lines and thus comprises a metallic, electrically conductive material such as copper, tungsten, aluminum, silicides, gold, silver, or alloys thereof, and the like. The metal is suitably deposited onto the patterned dielectric layer by art known techniques such as chemical vapor deposition (CVD), plasma enhanced CVD, electro and electroless deposition, sputtering or the like. Optionally, the circuit lines may be coated with a metallic liner such as a layer of nickel, tantalum or chromium or other layers such as barrier or adhesion layers (e.g., SiN, TiN).

Figure 6:
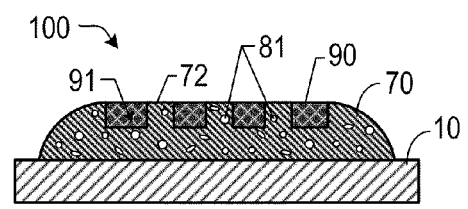
FIG. 6 is schematic sectional elevation showing the circuit formed by planarizing the conductive material deposited in the previous step.

Referring to FIG. 6, the last step of the process involves removal of excess metallic material (e.g., planarizing the metallic film 80) so that the top of the metal filled grooves 91 are generally level with the top of the patterned dielectric layer 72, resulting in integrated circuit device 100. Device 100 generally comprises substrate 10, metallic circuit lines 90 and dielectric material 70. Planarization can be accomplished using chemical/mechanical polishing or selective wet or dry etching. Suitable chemical/mechanical polishing techniques will be known to those skilled in the art. In device 100, the interconnected circuit lines 90 function to distribute electrical signals in the device and to provide power input to and signal output from the device. Suitable integrated circuit devices will generally comprise multiple layers of circuit lines, which are interconnected by vertical metallic studs (not shown in the figure).

In the more preferred embodiments, the polymerizable composition also includes a fluorosurfactant to improve the release properties and performance life of the imprint mold or tool. A presently preferred fluorosurfactant is a non-ionic polymeric fluorochemical surfactant sold under the trade name NOVEC FC-4432 by 3M Performance Materials Division (St. Paul, Minn.) Fluorosurfactant. An alternative fluorosurfacant includes ZONYL FSO-100, available from DuPont Corporation (Wilmington, Del.).

In a preferred polymerizable fluid composition, percentage or fraction decomposable polymer (porogen) to Si— is selected to produce a pore volume from about 10 to 40 volume %, and more preferably 20 to 30%, depending on the desired dielectric constant and the ultimate mechanical strength and durability required of the dielectric layer, it being understood that even for nanoscale pores, increasing the total porosity decreases the strength and durability. The porogen component preferably comprises from about 10 to 50 weight percent of the composition. Additionally it is preferable if the organic modified silicate comprises at least about 10 weight percent silicon. More preferably, the organic modified silicate has a molecular weight of less than about 50,000. Under such conditions, the polymerizable fluid composition preferably has viscosity of less than about 200,000 cPs.

EXAMPLE 1

As a theoretical example of a preferred composition for the polymerizable fluid of the instant invention, 79.5 g ORMOCER b59 UV curable organic modified silicate, 20 g TONE 0301 as the porogen and 0.5 g FC4432 of fluorosurfactant are mixed together. As ORMOCER b59 is available from the manufacturer premixed with the appropriate photo initiator the above composition can be used for imprint molding as described above when exposed to UV radiation of a wavelength that includes 365 nm. "TONE" 0310 is a poly (caprolactone) polyol (CAS Reg. No. 37625-56-2) having a relatively low-melting point and is tri-functional (3 —OH groups per molecule) with a number average molecular weight of about 900, and a hydroxyl number (mg KOH/g) of 187.0, being available from the Dow Chemical Company (Midland, Mich.). Other polycaprolactones deemed suitable without undue experimentation include CAPA 3031, which is available from Solvay Caprolactones (Warrington, Cheshire, United Kingdom).

It is expected that the inventive process is susceptible to achieving the smallest pore sizes, as the presence of the micro relief of the mold prior to the pore generation process minimizes the tendency for the nucleation and growth of larger pores.

It should be appreciated that one skilled in the art may select the substrate, mold, polymerizable fluid composition, surface modifying agent, as well as any other materials such that the method of the invention optimally functions according to the specific needs of the end user.

While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

What is claimed is:

1. A polymerizable composition comprising:
a) an organic modified silicate selected from the group consisting of silsesquioxanes having the composition $RSiO_{1.5}$, partially condensed alkoxysilanes, organically modified silicates having the composition $RSiO_3$ and $R_2SiO_2$, and partially condensed orthosilicates having the composition $SiOR_4$, where each R is an organic substituent independently comprising (meth)acrylate, vinyl, or epoxide, and each partially condensed alkoxysilane comprises one or more pendant functional groups independently comprising (meth)acrylate, vinyl, or epoxide;
b) a decomposable organic compound;
c) a photoinitiator; and
d) a release agent, wherein the composition polymerizes upon exposure to UV radiation to form an inorganic silica network, and the decomposable organic compound decomposes upon exposure to heat to form pores in the inorganic silica network.

2. The composition of claim 1, wherein the organic modified silicate has a molecular weight of less than about 50,000 Dalton.

3. The composition of claim 1, wherein the organic modified silicate comprises at least 10 weight percent silicon.

4. The composition of claim 1, wherein the decomposable organic compound is chemically bonded to the UV curable organic modified silicate.

5. The composition of claim 1, wherein the decomposable organic compound comprises from about 10 to 50 weight percent of the composition.

6. The composition of claim 1, wherein the decomposable organic compound is a polycaprolactone.

7. The composition of claim 1, wherein the release agent is a fluorosurfactant.

8. The composition of claim 1, further comprising a solvent.

9. The composition of claim 1, wherein a viscosity of the composition at 25° C. is in a range from about 0.01 centipoise to about 100 centipoise.

10. The composition of claim 1, wherein the pores have a dimension of about 3 nm to about 30 nm.

11. The composition of claim 1, wherein a volume of the pores in the inorganic silica network is between about 10 vol % and about 40 vol %.

12. The composition of claim 11, wherein the volume of the pores in the inorganic silica network is between about 20 vol % and about 30 vol %.

13. The composition of claim 1, wherein the inorganic silica network is a bonded —Si—O— network.

* * * * *